(12) United States Patent
Kim et al.

(10) Patent No.: US 8,194,447 B2
(45) Date of Patent: Jun. 5, 2012

(54) NON-VOLATILE MEMORY DEVICE USING VARIABLE RESISTANCE ELEMENT WITH AN IMPROVED WRITE PERFORMANCE

(75) Inventors: Hye-Jin Kim, Seoul (KR); Kwang-Jin Lee, Hwaseong-si (KR); Du-Eung Kim, Yongin-si (KR); Hung-Jun An, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 784 days.

(21) Appl. No.: 12/314,513

(22) Filed: Dec. 11, 2008

(65) Prior Publication Data

US 2009/0154221 A1 Jun. 18, 2009

(30) Foreign Application Priority Data

Dec. 14, 2007 (KR) .................. 10-2007-0131305

(51) Int. Cl.
*G11C 16/04* (2006.01)
(52) U.S. Cl. .......... 365/185.03; 365/185.21; 365/185.23
(58) Field of Classification Search ............. 365/189.09, 365/185.11, 185.23, 185.03, 185.21
See application file for complete search history.

(56) References Cited

U.S. PATENT DOCUMENTS

| | | |
|---|---|---|
| 5,034,922 A | 7/1991 | Burgess |
| 5,287,469 A | 2/1994 | Tsuboi |
| 5,822,244 A | 10/1998 | Hansen |
| 6,016,270 A | 1/2000 | Thummalapally et al. |
| 6,134,180 A | 10/2000 | Kim et al. |
| 6,279,070 B1 | 8/2001 | Jeong et al. |
| 6,480,438 B1 | 11/2002 | Park |
| 6,487,113 B1 | 11/2002 | Park et al. |
| 6,545,898 B1 | 4/2003 | Scheuerlein |
| 6,707,712 B2 | 3/2004 | Lowery |
| 6,754,107 B2 | 6/2004 | Khouri et al. |
| 6,781,860 B2 | 8/2004 | Parkinson |
| 6,930,925 B2 | 8/2005 | Guo et al. |
| 7,149,132 B2 | 12/2006 | Bedeschi et al. |
| 2003/0231523 A1* | 12/2003 | Cho et al. ................ 365/189.05 |
| 2004/0246808 A1 | 12/2004 | Cho et al. |
| 2005/0024922 A1 | 2/2005 | Li et al. |
| 2007/0217253 A1* | 9/2007 | Kim et al. ................ 365/163 |

FOREIGN PATENT DOCUMENTS

| | | |
|---|---|---|
| KR | 20000001436 | 1/2000 |
| KR | 20060004289 | 1/2006 |
| KR | 10-2007-0032427 | 3/2007 |

* cited by examiner

*Primary Examiner* — Richard Elms
*Assistant Examiner* — Hien Nguyen
(74) *Attorney, Agent, or Firm* — Harness, Dickey & Pierce, P.L.C.

(57) ABSTRACT

A non-volatile memory device using a variable resistive element includes a memory cell array having a plurality of non-volatile memory cells, a first voltage generator generating a first voltage, a voltage pad receiving an external voltage that has a level higher than the first voltage, a sense amplifier supplied with the first voltage and reading data from the non-volatile memory cells selected from the memory cell array, and a write driver supplied with the external voltage and writing data to the non-volatile memory cells selected from the memory cell array.

15 Claims, 12 Drawing Sheets

NON-VOLATILE MEMORY DEVICE USING VARIABLE RESISTANCE ELEMENT WITH AN IMPROVED WRITE PERFORMANCE

PRIORITY STATEMENT

This application claims priority under U.S.C. §119 to Korean Patent Application No. 10-2007-0131305, filed on Dec. 14, 2007, in the Korean Intellectual Property Office (KIPO), the entire contents of which are incorporated herein by reference.

BACKGROUND

1. Field

Example embodiments are directed to a non-volatile memory device using a variable resistance element.

2. Description of the Related Art

Non-volatile memory devices using a resistive material include, for example, phase change random access memories (PRAMs), resistive RAMs (RRAMs), magnetic RAMs (MRAMs) and the like. Dynamic RAMs (DRAMs) or flash memory devices use charge to store data, while the non-volatile memory devices using a resistive material store data using a variation in the phase or state of a phase change material, such as a chalcogenide alloy (PRAM), a variation in the resistance of a variable resistive element (RRAM), or a variation in the resistance of an MTJ (magnetic tunnel junction) film caused by the magnetized state of a ferromagnetic material (MRAM).

In the non-volatile memory device using a phase change material, the material changes from a crystalline state to an amorphous state or vice-versa depending on the change in temperature. The crystalline phase of the material has low resistance, while the amorphous phase has high resistance. The crystalline phase may define a first logic level, for example, set data or data of 0, and the amorphous phase may define a second logic level, for example, reset data or data of 1.

In addition, the phase change memory device applies a set pulse or a reset pulse to the phase change material to generate heat and perform a write operation. To write reset data, the phase change memory device applies the reset pulse to the phase change material to heat it to a temperature higher than its melting point, and rapidly cools the phase change material into an amorphous state. To write set data, the phase change memory device applies the set pulse to the phase change material to heat it to a temperature higher than the crystallization point, but below the melting point, maintains the temperature for a predetermined time, and then cools the phase change material transforming it into a crystalline state. In this case, the time required to write the set data is around five times longer than that required to write the reset data. For example, 600 ns may be required to write the set data, and 120 ns may be required to write the reset data.

SUMMARY

Example embodiments are directed to a non-volatile memory device with an improved write performance.

According to example embodiments, a non-volatile memory device may include a memory cell array having a plurality of non-volatile memory cells, a first voltage generator generating a first voltage, a voltage pad receiving an external voltage that has a level higher than the first voltage, and a write driver supplied with the external voltage and writing data to the plurality of non-volatile memory cells selected from the memory cell array.

According to example embodiments, the non-volatile memory device may further include a sense amplifier supplied with the first voltage and reading data from the plurality of non-volatile memory cells selected from the memory cell array.

According to example embodiments, the write driver of the non-volatile memory device may be part of a plurality of write drivers within a write driver block supplied with the external voltage, the write driver clock simultaneously writing data to eight or more non-volatile memory cells selected from the memory cell array.

According to another example embodiment, the first voltage generator may generate the first voltage using the external high voltage.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
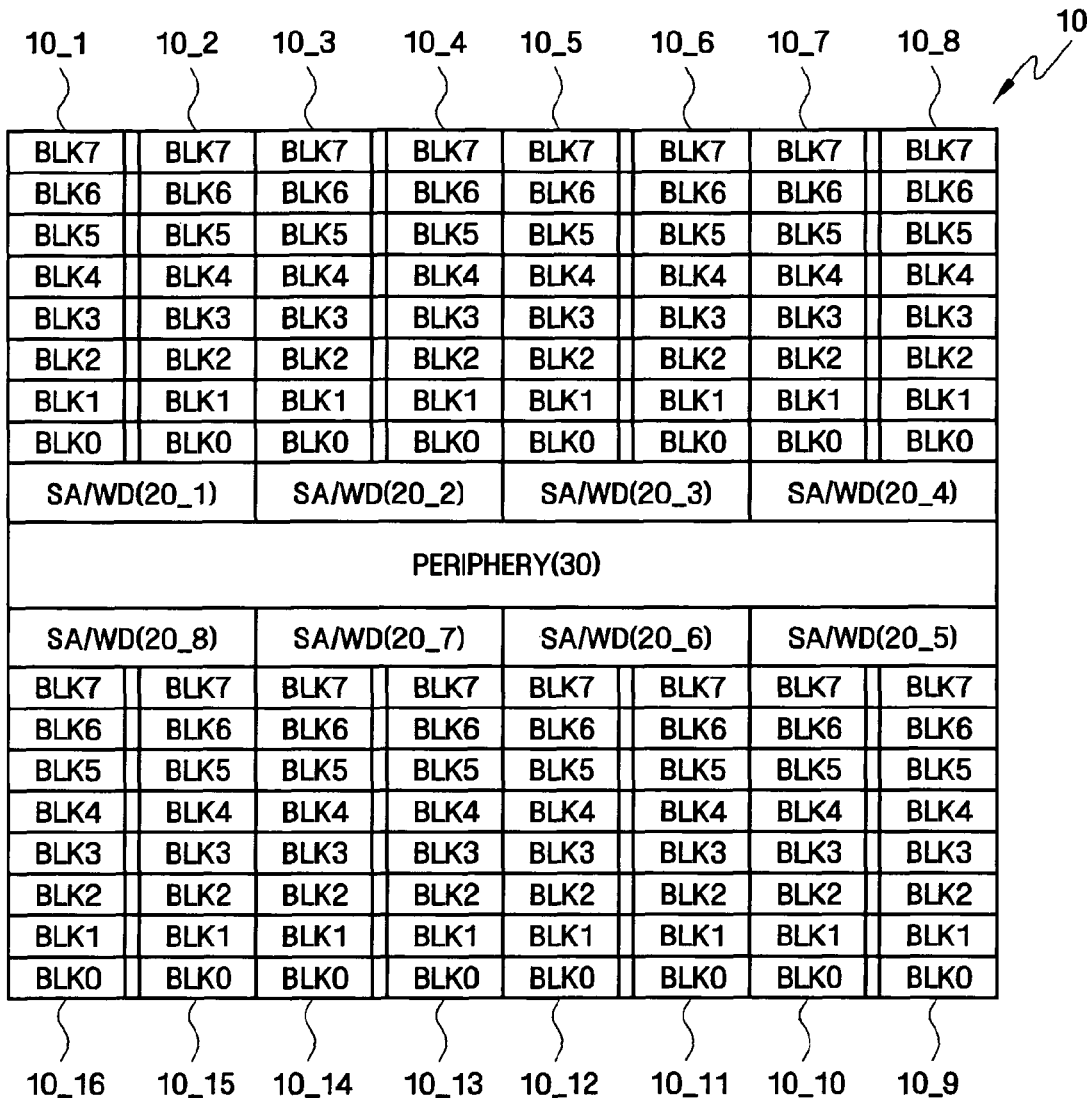
FIG. 1 is a layout illustrating the arrangement of elements of a non-volatile memory device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

While example embodiments as discussed below are directed to phase change random access memories (PRAMs), it will be understood by those skilled in the art that the example embodiments may also be applied to other kinds of non-volatile memory devices using a resistive material, such as resistive RAM (RRAM), a ferroelectric RAM (FRAM) or the like.

FIG. 1 is a layout illustrating the arrangement of elements of a non-volatile memory device according to example embodiments. In the example embodiments described below, 16 memory banks are provided for the purposes of clarity and ease in describing the various example embodiments. However, it will be recognized that the example embodiments are not limited thereto.

Referring to FIG. 1, a non-volatile memory device according to the example embodiments may include a memory cell array 10, a plurality of sense amplifiers and write drivers 20_1 to 20_8, and a peripheral circuit region 30.

The memory cell array 10 may include a plurality of memory banks 10_1 to 10_16, each memory bank 10_1 to 10_16 including a plurality of memory blocks BLK0 to BLK7. The memory blocks BLK0 to BLK7 may each include a plurality of phase change memory cells arranged in a matrix. In the example embodiments, each memory bank includes 8 memory blocks. However, example embodiments may also include memory banks, each including 16 or 32 memory blocks or the multiples thereof.

Although not shown in detail in the drawings, one skilled in the art will easily recognize that a row decoder and a column decoder may be provided to correspond to the memory banks 10_1 to 10_16 and to designate rows and columns of phase change memory cells to or from which data may be written or read, respectively.

As illustrated in FIG. 1, each sense amplifier and write driver 20_1 to 20_8 may correspond to two memory banks 10_1 to 10_16, and may read data from or write data to the corresponding memory banks. However, example embodiments are not limited thereto. Each sense amplifier and write driver 20_1 to 20_8 may correspond to one memory bank (for example, as illustrated in FIG. 1) or four memory banks.

The periphery circuit region 30 may comprise a plurality of logic circuit blocks and voltage generators that operate, for example, the row decoder, the column decoder, and the sense amplifiers and write drivers.

Figure 2:
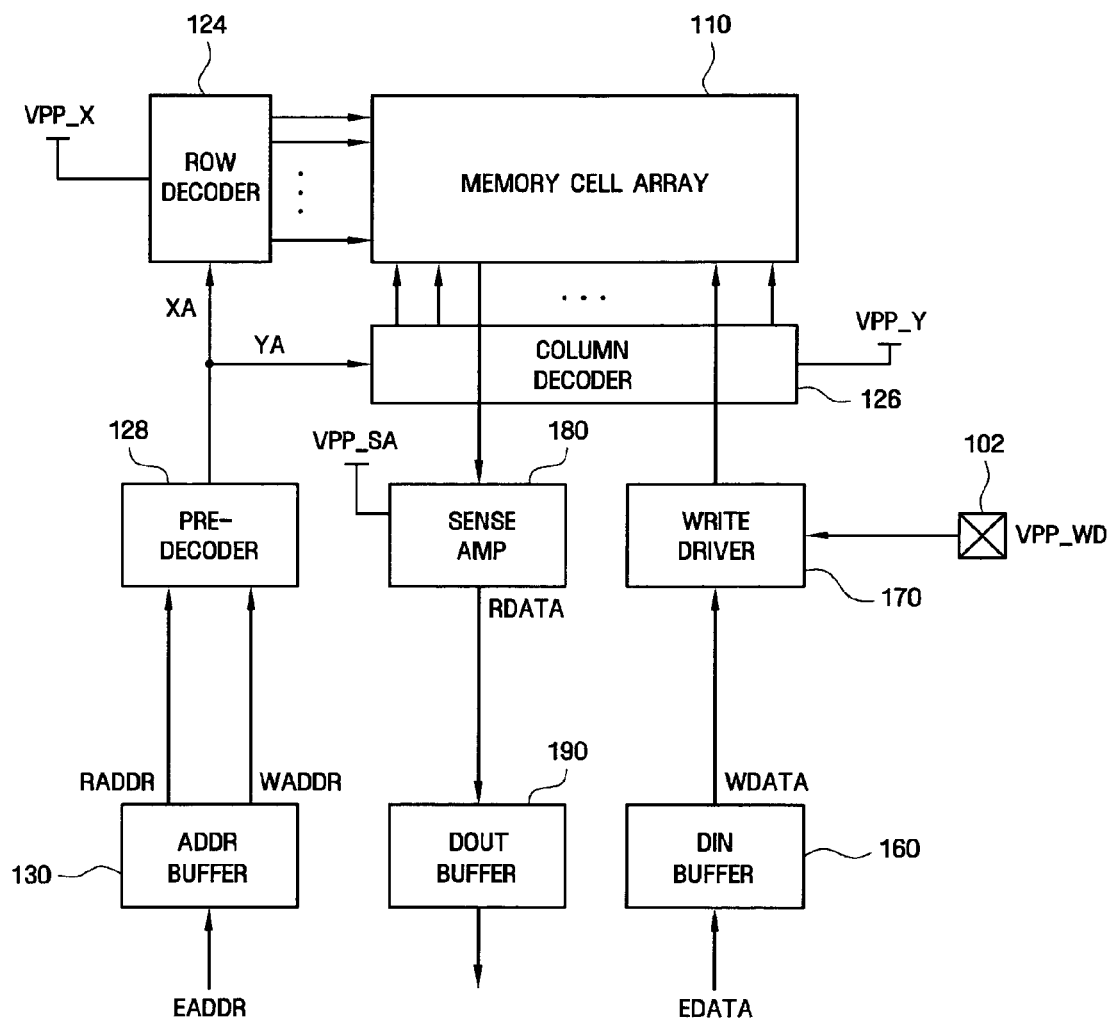
FIG. 2 is a block diagram illustrating the operation of a non-volatile memory device according to an example embodiment.
Figure 3:
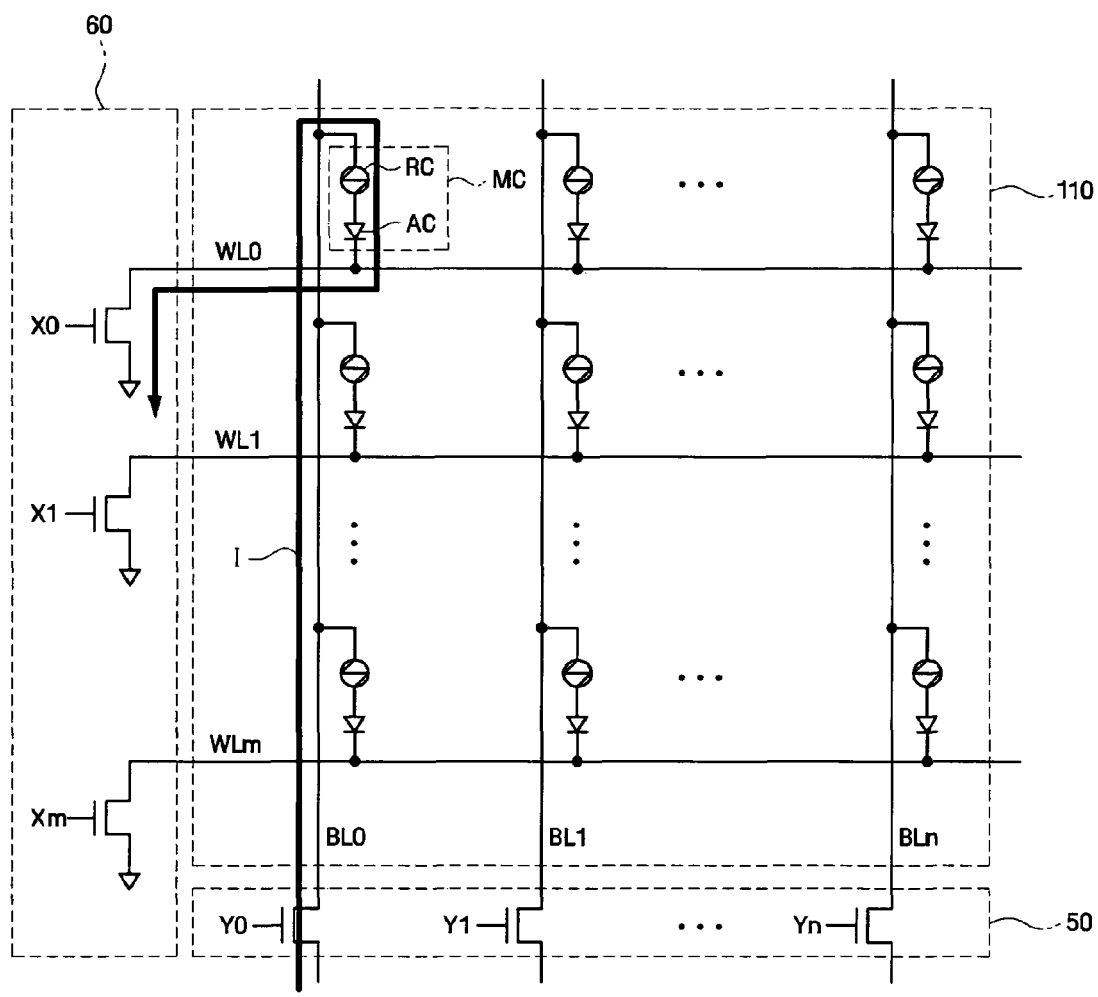
FIG. 3 illustrates the memory cell array of FIG. 2 and the peripheral circuitry thereof.

Referring to FIGS. 2 and 3, the non-volatile memory device according to an example embodiment may include a memory cell array 110, a row decoder 124, a column decoder 126, a pre-decoder 128, an address buffer 130, a data input buffer 160, a write driver 170, and a data output buffer 190.

The memory cell array 110 may include a plurality of non-volatile memory cells MC. The plurality of non-volatile memory cells MC may be disposed at the intersections of word lines WL0 to WLm and bit lines BL0 to BLn. The non-volatile memory cell MC may change its phase or state between crystalline and amorphous depending on a shot-through current, and may include a phase change material RC whose resistance may vary according to its phase, and an access element AC that may control the shot-through current flowing through the phase change material RC. A variety of materials may be used as the phase change material RC. For example, the phase change material RC may include: a compound of two elements, such as GaSb, InSb, InSe, $Sb_2Te_3$, or GeTe; a compound of three elements, such as GeSbTe, GaSeTe, InSbTe, $SnSb_2Te_4$, or InSbGe; and a compound of four elements, such as AgInSbTe, GeSnSbTe, GeSb SeTe, or $Te_{81}Ge_{15}Sb_2S_2$. Among the above materials, GeSbTe, which is a compound of germanium (Ge), antimony (Sb), and tellurium (Te), may primarily be used as phase change material RC and a cell diode may be used as the access element AC, but the invention is not limited thereto. For example, a transistor or a similar device may be used as the access element and any material exhibiting change in phase or state according to change in temperature may be used as a phase change material RC.

As shown in FIG. 2, the row decoder 124 may receive a row address XA from the pre-decoder 128, decode the row address XA, and may select a row of phase change memory cells to which data may be written. For example, as shown in FIG. 3, the row decoder 124 may enable any one of the row selection signals X0 to Xm to turn on a corresponding row selecting transistor of a row selecting unit 60.

The column decoder 126 may receive a column address YA from the pre-decoder 128, decode the column address YA, and may select a column of phase change memory cells to which data may be written. For example, as shown in FIG. 3, the column decoder 126 may enable any one of the column selection signals Y0 to Yn to turn on a corresponding column selecting transistor of a column selecting unit 50.

The address buffer 130 may receive an external address EADDR, buffer the external address EADDR, and may provide to the pre-decoder 128 a read address RADDR for a read operation or a write address WADDR for a write operation.

The data input buffer 160 may receive external data EDATA, buffer the external data EDATA, and may provide write data WDATA to the write driver 170. The write driver 170 may receive the write data WDATA, and may write the write data WDATA to the non-volatile memory cells MC selected from the memory cell array 110.

The sense amplifier 180 may output read data RDATA read from the non-volatile memory cells MC selected from the memory cell array 110 to the data output buffer 190. The data output buffer 190 outputs the read data RDATA.

During the write operation, the write driver 170 may supply a write current (for example, a set pulse or a reset pulse) to the selected non-volatile memory cell MC. For example, the write current may flow to the ground through a column selecting transistor Y0 of the column selecting unit 50, the bit line BL0, the non-volatile memory cell MC, the word line WL0, and a row selecting transistor X0 of the row selecting unit 60, as represented by an arrow I in FIG. 3.

A read current during the read current may also flow as represented by the arrow I in FIG. 3, for example.

Figure 4:
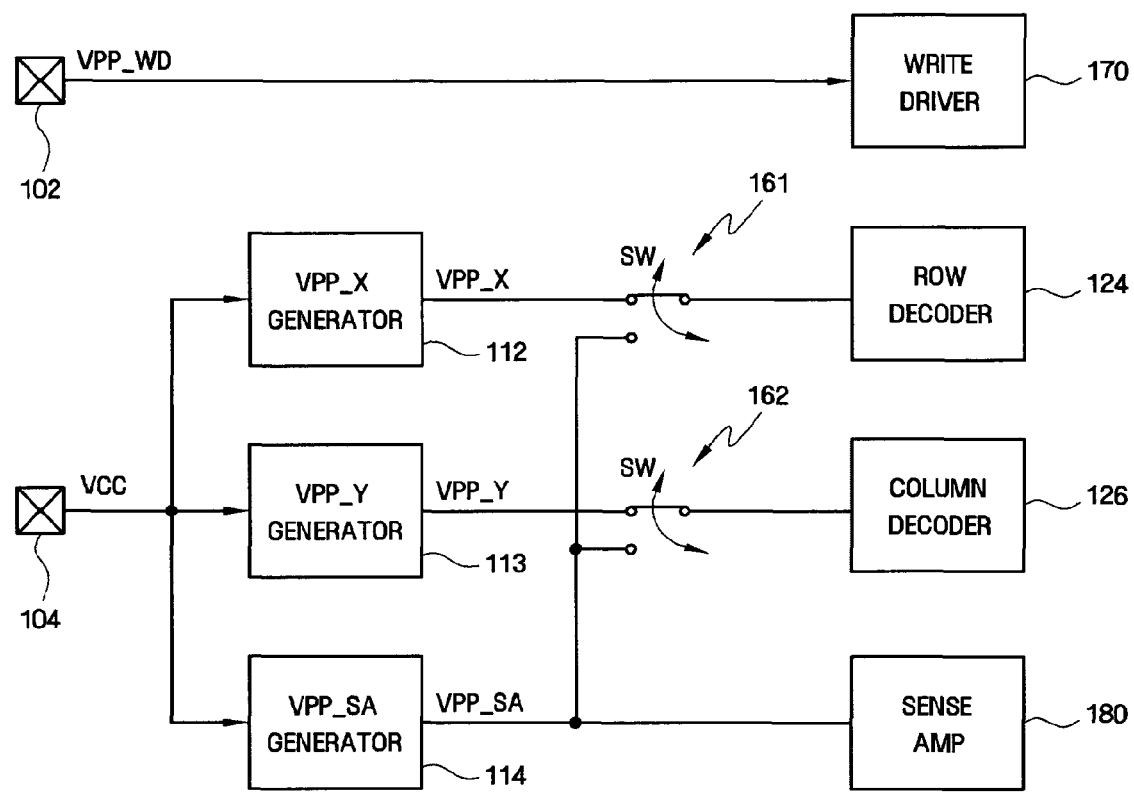
FIG. 4 is a block diagram illustrating voltages applied to some of the circuit blocks of the non-volatile memory device according to the first example embodiment.

Referring to FIGS. 2 and 4, an external voltage VPP_WD may be applied through a first voltage pad 102, and a power supply voltage VCC may be applied through a second voltage pad 104.

The external voltage VPP_WD may have a level higher than the power supply voltage VCC. First to third high-voltage generators 114, 112, and 113 may generate first to third high voltages VPP_SA, VPP_X, and VPP_Y, respectively, using the power supply voltage VCC (for example, pumping the power supply voltage VCC). In the specification, the term "high voltage" means a voltage having a level that is higher than the power supply voltage VCC. Accordingly, first to third high voltages VPP_SA, VPP_X, and VPP_Y have voltage levels higher than the power supply voltage VCC.

However, the second high voltage VPP_X may have a voltage level higher than the first high voltage VPP_SA, and the third high voltage VPP_Y may have a voltage level higher than the second high voltage VPP_X. The external voltage VPP_WD may have a voltage level that is about the same as the third high voltage VPP_Y. For example, the power supply voltage VCC may be 1.8 V, the first high voltage VPP_SA may be about 3 V, the second high voltage VPP_X may be about 3.5 V, and the third high voltage VPP_Y and the external voltage VPP_WD may be about 4.8 V.

In the first example embodiment, the write driver 170 may be supplied with the external voltage VPP_WD. On the other hand, the sense amplifier 180, the row decoder 124, and the column decoder 126 may be respectively supplied with the first to third high voltages VPP_SA, VPP_X, and VPP_Y, which may be internally generated in the non-volatile memory device. During the write operation, switches 161 and 162 may operate such that the sense amplifier 180, the row decoder 124, and the column decoder 126 are respectively supplied with the first to third high voltages VPP_SA, VPP_X, and VPP_Y. During a standby operation or the read operation the sense amplifier 180, the row decoder 124, and the column decoder 126 may be supplied with the first high voltage VPP_SA.

The reason for this difference in voltages applied to the sense amplifier 180, the row decoder 124, the column decoder 126 during the write, standby, and read operations will be understood from the discussion that follows.

As described above, during the write operation and the read operation, a write current and a read current may respectively flow through the column selecting transistors of the column selecting unit 50 and the row selecting transistors of the row selecting unit 60. The levels of the column selection signals Y0 to Yn applied to the gates of the column selecting transistors and the levels of the row selection signals X0 to Xm applied to the gates of the row selecting transistors may be controlled such that the read and write currents flow through the column and row selecting transistors.

Since the level of the external voltage VPP_WD used by the write driver 170 during the write operation may be about 4.8 V, the level of the second high voltage VPP_X used by the row decoder 124 and the level of the third high voltage VPP_Y used by the column decoder 126 are respectively may be set to about 3.5 V and 4.8 V to correspond with the level of the external voltage VPP_WD.

Meanwhile, since the level of the first high voltage VPP_SA used by the sense amplifier 180 during the read operation is about 3 V and the row decoder 124 and the column decoder 126 do not need to use the voltages used during the write operation (that is, 3.5 V and 4.8 V). Therefore, the row decoder 124 and the column decoder 126 may use the first high voltage VPP_SA of about 3 V.

Figure 5:
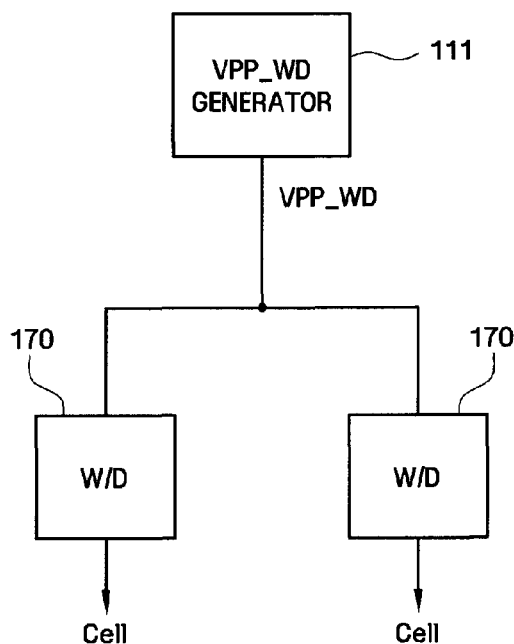
FIGS. 5 and 6 illustrate a write operation of a conventional art non-volatile memory device.
Figure 6:
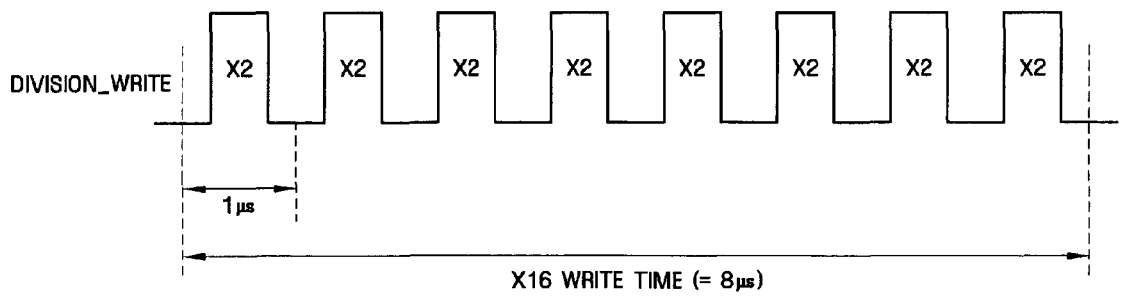
Figure 7:
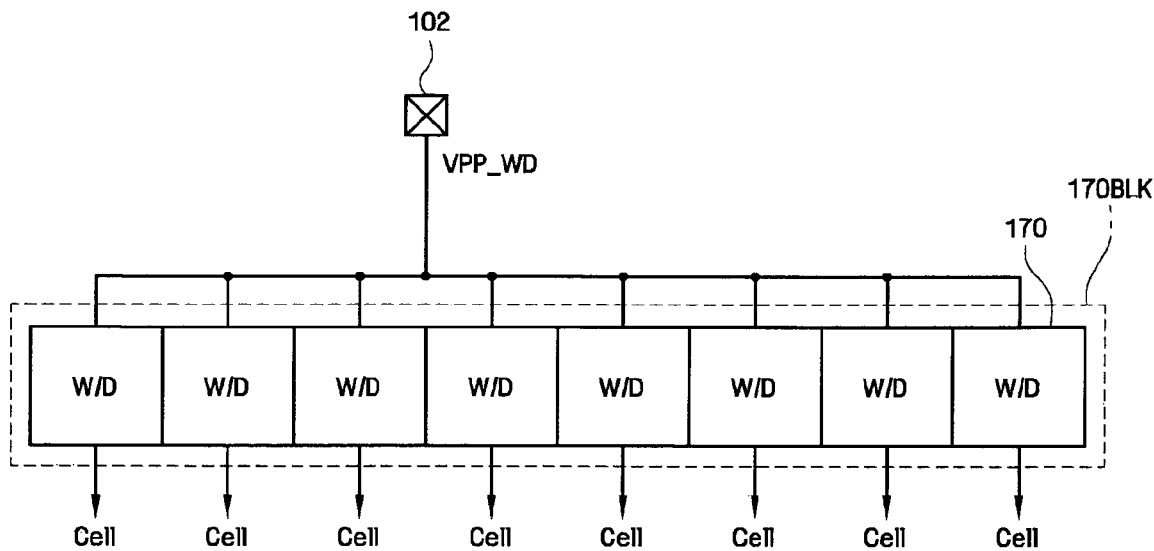
FIGS. 7 and 8 illustrate a write operation of the non-volatile memory device according to an example embodiment.
Figure 8:
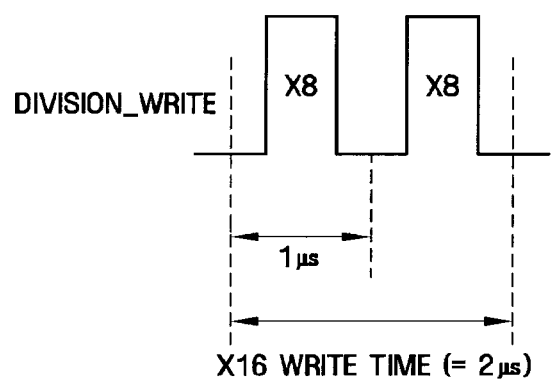

Next, the reason why the write driver 170 uses the external voltage VPP_WD applied from the outside will be discussed below. FIGS. 5 and 6 illustrate the write driver 170 driven by the voltage generated by a voltage generator 111 in a conventional non-volatile memory device. FIGS. 7 and 8 illustrate the write driver 170 is driven by the external voltage VPP_WD according to an example embodiment.

Referring to FIGS. 5 and 6, it is difficult to simultaneously write data that is input through a plurality of input/output pins (for example, 16 pins) to a plurality of non-volatile memory cells (for example, 16 non-volatile memory cells). For example, when the current level of the reset pulse supplied to one non-volatile memory cell is 1 mA, a total of 16 mA is needed to simultaneously write data to 16 non-volatile memory cells. However, if the efficiency of the voltage generator 111 is low, for example 10%, a current of 160 mA is required to flow through the non-volatile memory device in order to simultaneously write data to the 16 non-volatile memory cells. However, a current of 15 to 30 mA flows through the non-volatile memory device during the write operation. In addition, data is written individually to each cell group (division write) since the voltage generator 111 has limited current drive capability. A cell group means a group of one or more non-volatile memory cells to which data is simultaneously written. For example, as shown in FIG. 5, the voltage generator 111 may generate a sufficiently high voltage to operate two write drivers 170. As shown in FIG. 6, 16 non-volatile memory cells are classified into 8 cell groups, and data is written during 8 division write sessions. During one division write session, data is written to two non-volatile memory cells. Therefore, if one division write session is performed for 1 μs, 8 μs are required to write data to 16 non-volatile memory cells.

Referring to FIGS. 7 and 8, the above-mentioned limitations may be overcome if the write driver 170 is driven directly by the external voltage VPP_WD. With a voltage generator absent, efficiency may be ignored. Therefore, as shown in FIG. 7, for example, 8 write drivers 170 can operate simultaneously. Accordingly, as shown in FIG. 8, if one division write session is performed for 1 μs, 2 μs are required to write data to 8 non-volatile memory cells. As a result, a write performance is improved when the write driver 170 is driven by the external voltage VPP_WD as the write driver can be operated at a higher speed than when it is driven by a high voltage generated internally in the device.

As illustrated in FIG. 7, a write driver block 170BLK including 8 write drivers 170 may simultaneously write data to 8 non-volatile memory cells, but the invention is not limited thereto. The write driver block 170BLK may simultaneously write data to eight or more non-volatile memory cells. For example, the write driver block 170BLK may simultaneously write data to 8, 16, 32, or 64 non-volatile memory cells or the multiples thereof. In FIGS. 5 to 8, the current level of the reset pulse applied to one non-volatile memory cell is 1 mA. However, a lower current level of the reset pulse, for example 0.8 mA or 0.6 mA, may also be used to simultaneously write data to a larger number of non-volatile memory cells.

Figure 9:
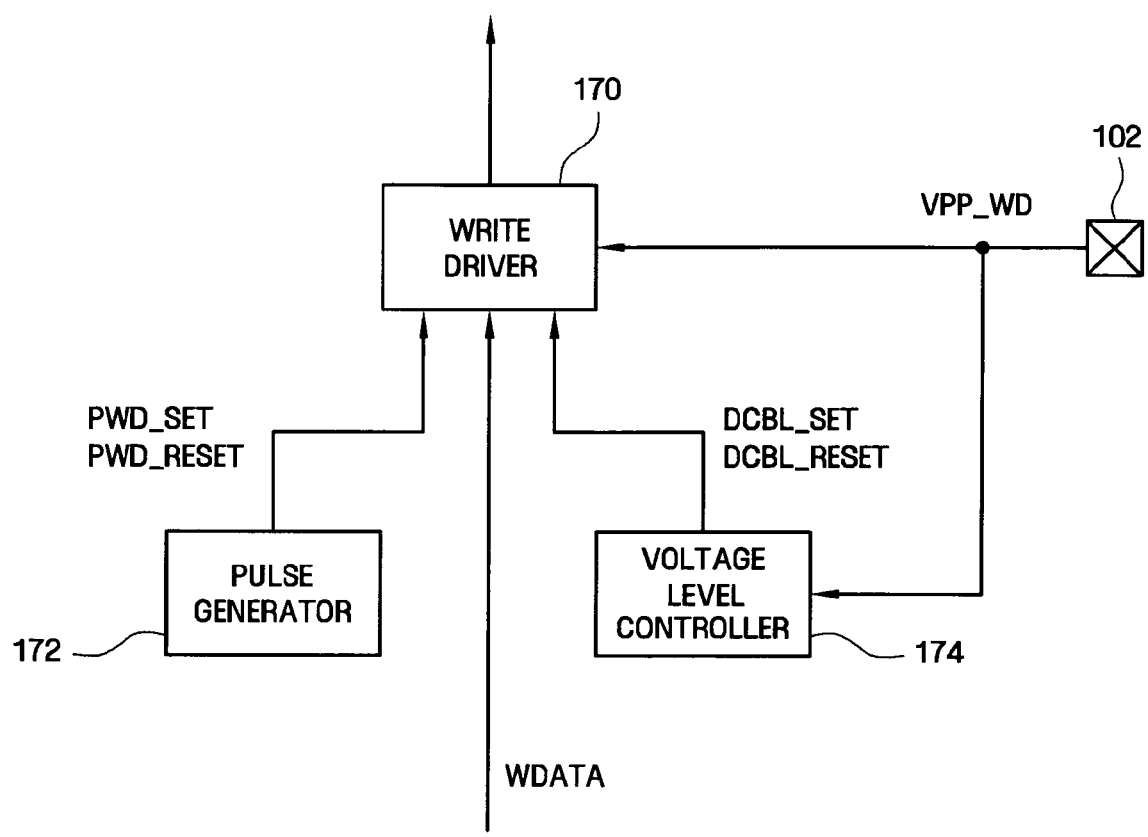
FIG. 9 illustrates the operation of a non-volatile memory device according to a second example embodiment.

FIG. 9 is a block diagram illustrating the operation of a non-volatile memory device according to a second example embodiment.

Next, a method of providing a set pulse for writing set data or a reset pulse for writing reset data to the non-volatile memory cells selected by the write driver 170 will be described with reference to FIG. 9.

The write driver 170 may receive a set control signal PWD_SET and a reset control signal PWD_RESET from a pulse generator 172. In addition, the write driver 170 may receive a set voltage DCBL_SET and a reset voltage DCBL_RESET from a voltage level controller 174.

When receiving write data WDATA corresponding to set data, the write driver 170 may generate a set pulse using the set voltage DCBL_SET while the set control signal PWD_SET is enabled. When receiving write data WDATA corresponding to reset data, the write driver 170 may generate a reset pulse using the reset voltage DCBL_RESET while the reset control signal PWD_RESET is enabled. The set voltage DCBL_SET and the reset voltage DCBL_RESET have substantially the same waveforms as those of the set pulse and the reset pulse, respectively.

In the second example embodiment, the write driver 170 and the voltage level controller 174 may use the external voltage VPP_WD applied through the first voltage pad 102.

Figure 10:
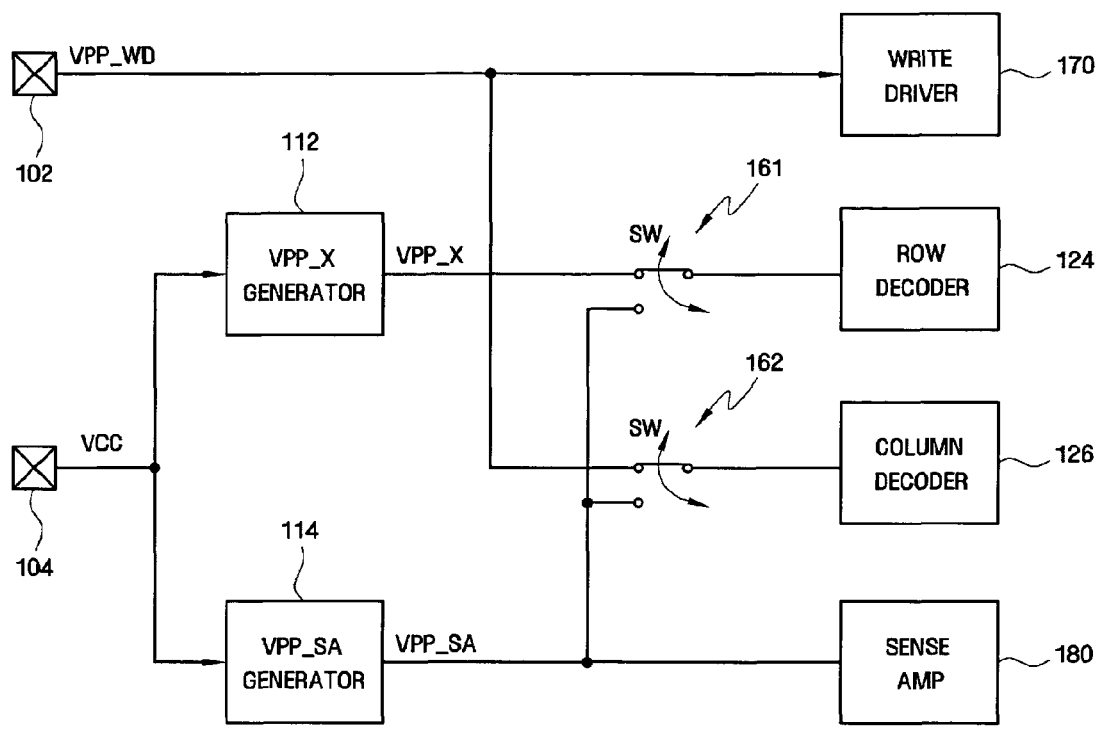
FIG. 10 illustrates the operation of a non-volatile memory device according to a third example embodiment.

FIG. 10 is a block diagram illustrating the operation of a non-volatile memory device according to a third example embodiment.

Referring to FIG. 10, the non-volatile memory device according to the third example embodiment may differ from the first example embodiment in that the column decoder 126 may be directly supplied with the external voltage VPP_WD applied through the first voltage pad 102. This is possible because the level of the voltage used by the column decoder 126 is substantially equal to that of the voltage used by the write driver 170, as discussed above.

Figure 11:
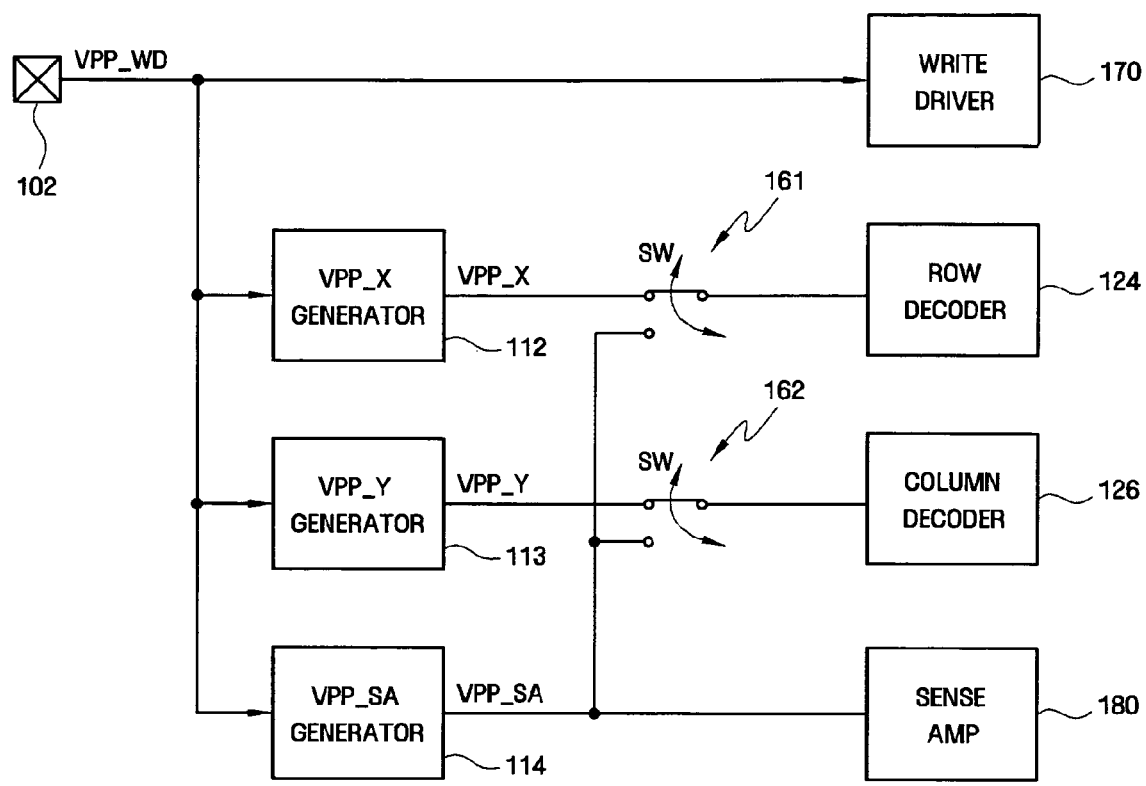
FIG. 11 illustrates the operation of a non-volatile memory device according to a fourth example embodiment.

FIG. 11 is a block diagram illustrating the operation of a non-volatile memory device according to a fourth example embodiment.

Referring to FIG. 11, the non-volatile memory device according to the fourth example embodiment may differ from the first example embodiment in that the first to third high voltage generators 114, 112, and 113 may use the external voltage VPP_WD to generate the first to third high voltages VPP_SA, VPP_X, and VPP_Y, respectively. Accordingly, the first to third high voltage generators 114, 112, and 113 may step down the external voltage VPP_WD (for example, use voltage distribution) to generate the first to third high voltages VPP_SA, VPP_X, and VPP_Y.

This method of stepping down the voltage to generate the first to third high voltages VPP_SA, VPP_X, and VPP_Y may be easier than the method of pumping up the voltage (see, for example, the first example embodiment).

Figure 12:
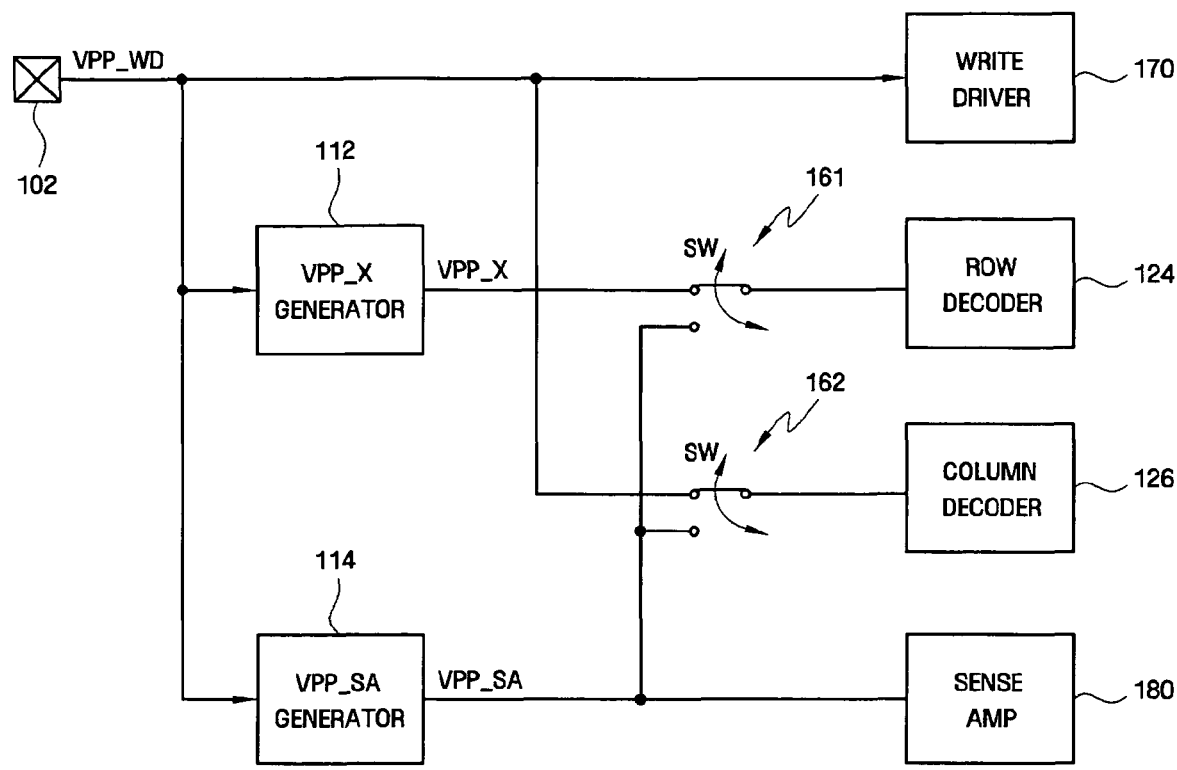
FIG. 12 illustrates the operation of a non-volatile memory device according to a fifth example embodiment.

FIG. 12 is a block diagram illustrating the operation of a non-volatile memory device according to a fifth example embodiment.

Referring to FIG. 12, the non-volatile memory device according to the fifth example embodiment may differ from that according to the fourth example embodiment in that the column decoder 126 may also be directly supplied with the external voltage VPP_WD through the first voltage pad 102.

Figure 13:
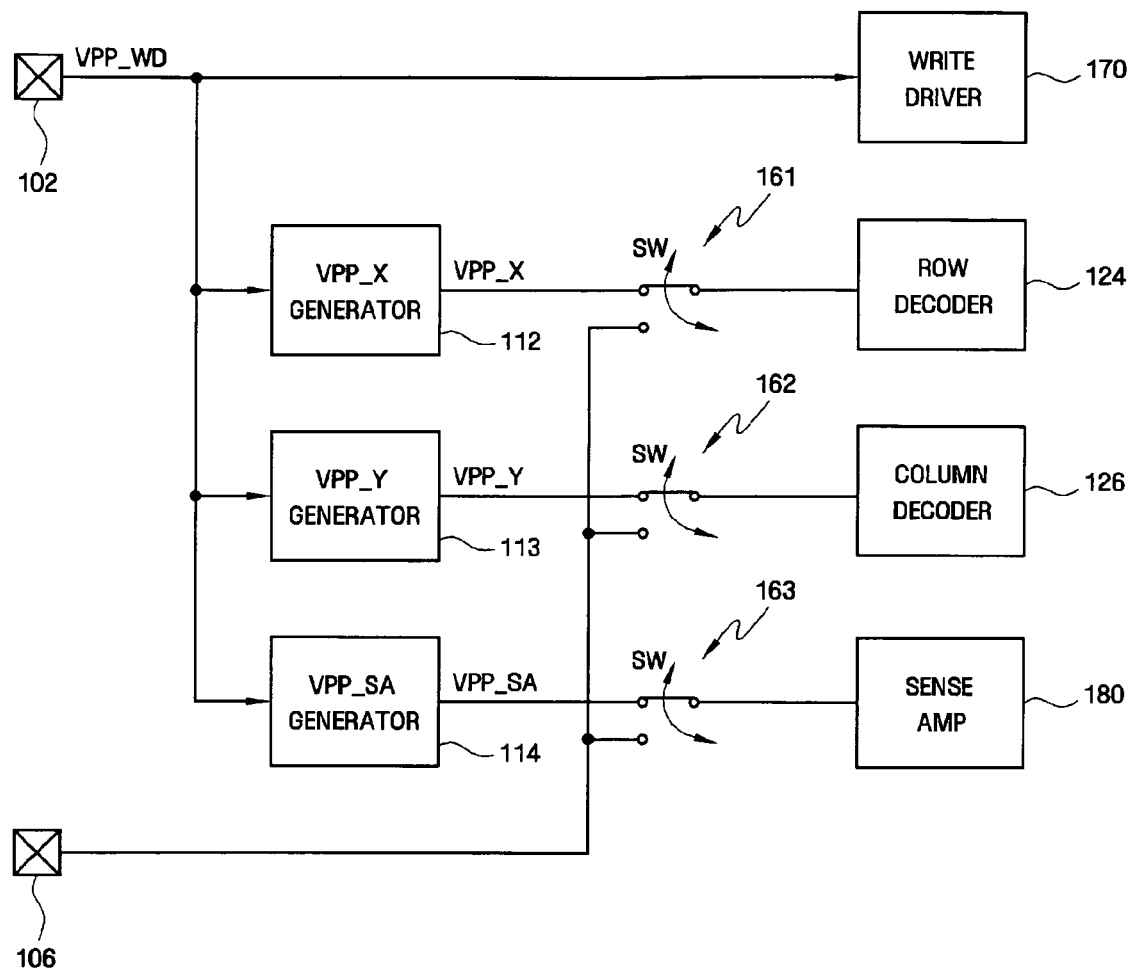
FIG. 13 illustrates the operation of a non-volatile memory device according to a sixth example embodiment.

FIG. 13 a block diagram illustrating the operation of a non-volatile memory device according to a sixth example embodiment.

Referring to FIG. 13, the non-volatile memory device according to the sixth example embodiment may differ from the first to fourth example embodiments in that a separate voltage for a read operation may be applied through a third voltage pad 106. Accordingly, the switches 161, 162, and 163 may operate such that the sense amplifier 180, the row decoder 124, and the column decoder 126 are respectively supplied with the first to third high voltages VPP_SA, VPP_X, and VPP_Y generated in the device during the write operation and the sense amplifier 180, the row decoder 124, and the column decoder 126 are supplied with the separate voltage during the standby operation or the read operation.

Although not shown in the drawings, the non-volatile memory devices, according to some of the example embodiments discussed above, may further include a separate voltage pad for receiving a power supply voltage for an interface, and an input/output interface may be supplied with the power supply voltage for an interface and input/output data.

In the example embodiments discussed above, the write driver 170, the sense amplifier 180, the row decoder 124, and the column decoder 126 may all use high voltages, but example embodiments are not limited thereto. For example, the write driver 170, the sense amplifier 180, the row decoder 124, and the column decoder 126 may not all use high voltages as long as the write driver 170 may perform a write operation using an external voltage.

Figure 14:
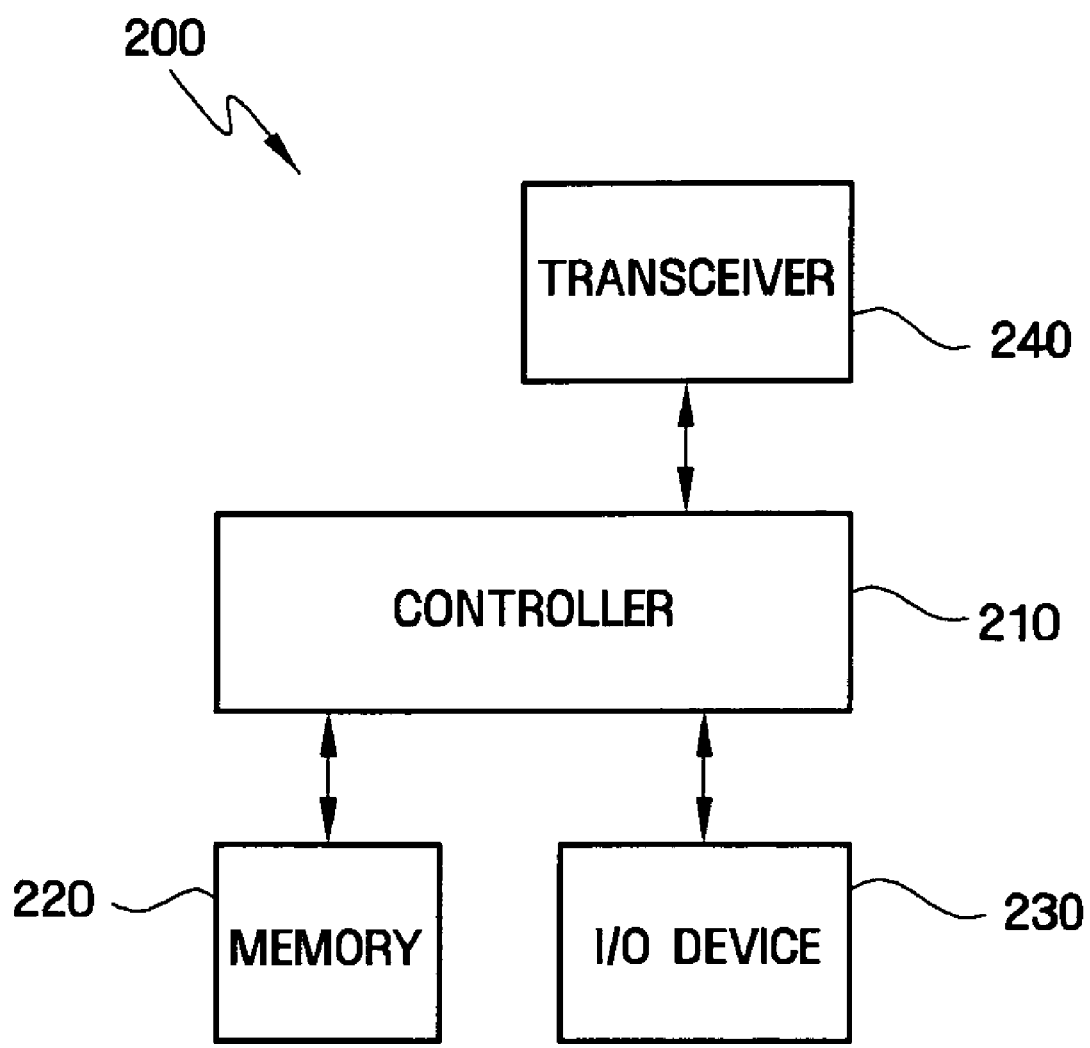
FIG. 14 illustrates a memory system including the non-volatile memory device according to the example embodiments.

FIG. 14 is a block diagram illustrating a memory system including the non-volatile memory device according to the example embodiments discussed above. In FIG. 14, a portable media system may be used as the memory system, but the memory system is not limited to the portable media system. Examples of the portable media system may include mobile phones, two-way radio communication systems, one way pagers, two-way pagers, personal communication systems, portable computers, personal digital assistants (PDAs), MP3 (MPEG audio layer-3) players, digital cameras and the like.

Referring to FIG. 14, a memory system 200 including the non-volatile memory device according to the example embodiments discussed above may include a controller 210, a memory 220, an I/O device 230, and a transceiver 240.

The controller 210 may be, for example, a microprocessor, a digital signal processor, a microcontroller or the like.

The memory 220 may be controlled by the controller 210 and may store data or instructions issued by the controller 210 during the operation of the memory system 200 to be transmitted to the memory system 200 or the outside. The memory 220 may include memories of a single type or multiple types. For example, the memory 220 may be a volatile memory device or a non-volatile memory device. The non-volatile memory device may be the non-volatile memory device using a resistive element according to the example embodiments discussed above.

The I/O device 230 may be operated by the user to generate a message. The I/O device 230 may include, for example, a keypad and a monitor.

The memory system 200 may use the transceiver 240 connected to an antenna (not shown) to wirelessly transmit or receive messages. The memory system 200 may transmit or receive messages using a protocol, such as CDMA (code division multiple access), GSM (global system for mobile communication), NADC (north 20 American digital cellular), TDMA (time division multiple access), ETDMA (extended TDMA), 3G WCDMA (wideband CDMA), CDMA-2000, or the like.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

Which is claimed is:
1. A non-volatile memory device comprising:
a memory cell array including a plurality of non-volatile memory cells;
a first voltage generator generating a first voltage;
a voltage pad receiving an external voltage that has a level higher than the first voltage; and
a write driver supplied with the external voltage and writing data to the plurality of non-volatile memory cells selected from the memory cell array;
a sense amplifier supplied with the first voltage and reading data from the plurality of non-volatile memory cells selected from the memory cell array;
a row decoder and a column decoder for selecting the plurality of non-volatile memory cells included in the memory cell array; and
second and third voltage generators respectively generating second and third voltages higher than the first voltage, wherein the row decoder is supplied with the second voltage and the column decoder is supplied with the third voltage.

2. The non-volatile memory device of claim 1, wherein:
the row decoder and the column decoder are respectively supplied with the second voltage and the third voltage during a write operation; and
the row decoder and the column decoder are both supplied with the first voltage during a read operation.

3. The non-volatile memory device of claim 1, wherein the third voltage has a level higher than the second voltage.

4. The non-volatile memory device of claim 1, wherein the second and third voltage generators are supplied with the external voltage and respectively generate the second and third voltages.

5. The non-volatile memory device of claim 1, wherein the second and third voltage generators are supplied with a power supply voltage and respectively generate the second and third voltages.

6. A non-volatile memory device comprising:
a memory cell array including a plurality of non-volatile memory cells;
a first voltage generator generating a first voltage;
a voltage pad receiving an external voltage that has a level higher than the first voltage; and
a write driver supplied with the external voltage and writing data to the plurality of non-volatile memory cells selected from the memory cell array;
a sense amplifier supplied with the first voltage and reading data from the plurality of non-volatile memory cells selected from the memory cell array;
a row decoder and a column decoder for selecting the plurality of non-volatile memory cells included in the memory cell array; and
a second voltage generator generating a second voltage that is higher than the first voltage, wherein the row decoder is supplied with the second voltage and the column decoder is supplied with the external voltage.

7. The non-volatile memory device of claim 6, wherein:
the row decoder and the column decoder are respectively supplied with the second voltage and the external voltage during a write operation; and
the row decoder and the column decoder are both supplied with the first voltage during a read operation.

8. A non-volatile memory device comprising:
a memory cell array including a plurality of non-volatile memory cells;
a first voltage generator generating a first voltage;
a voltage pad receiving an external voltage that has a level higher than the first voltage; and
a write driver supplied with the external voltage and writing data to the plurality of non-volatile memory cells selected from the memory cell array;
a sense amplifier supplied with the first voltage and reading data from the plurality of non-volatile memory cells selected from the memory cell array;
a row decoder and a column decoder for selecting the plurality of non-volatile memory cells included in the memory cell array; and
a separate voltage pad supplied with a voltage for reading that has a level lower than the external voltage, wherein the sense amplifier, the row decoder and the column decoder are supplied with the voltage for reading during a read operation.

9. A non-volatile memory device comprising:
a memory cell array including a plurality of non-volatile memory cells;
a first voltage generator generating a first voltage;
a voltage pad receiving an external voltage that has a level higher than the first voltage; and a write driver supplied with the external voltage and writing data to the plurality of non-volatile memory cells selected from the memory cell array;

a sense amplifier supplied with the first voltage and reading data from the plurality of non-volatile memory cells selected from the memory cell array;

a separate voltage pad supplied with a power supply voltage for an interface; and an input/output interface supplied with the power supply voltage for an interface and inputting/outputting data.

10. A non-volatile memory device comprising:

a memory cell array including a plurality of non-volatile memory cells;

a first voltage generator generating a first voltage;

a voltage pad receiving an external voltage that has a level higher than the first voltage; and a write driver supplied with the external voltage and writing data to the plurality of non-volatile memory cells selected from the memory cell array;

a sense amplifier supplied with the first voltage and reading data from the plurality of non-volatile memory cells selected from the memory cell array;

a row decoder and a column decoder for selecting the plurality of non-volatile memory cells included in the memory cell array, wherein the write driver is a part of a plurality of write drivers within a write driver block supplied with the external high voltage, the write driver block simultaneously writing data to eight or more non-volatile memory cells selected from the memory cell array.

11. The non-volatile memory device of claim 10, wherein the write driver block simultaneously writes data to 8, 16, 32, or 64 non-volatile memory cells.

12. The non-volatile memory device of claim 10, further comprising:

a second voltage generator generating a second voltage; and a third voltage generator generating a third voltage, wherein the row decoder is supplied with the second voltage, and the column decoder is supplied with the third voltage.

13. The non-volatile memory device of claim 12, wherein the second voltage has a level higher than the first voltage and the third voltage has a level higher than the second voltage.

14. A non-volatile memory device comprising:

a memory cell array including a plurality of non-volatile memory cells;

a first voltage generator generating a first voltage, wherein the first voltage has a level higher than a power supply voltage;

a voltage pad receiving an external voltage that has a level higher than the first voltage; and a write driver supplied with the external voltage and writing data to the plurality of non-volatile memory cells selected from the memory cell array;

a sense amplifier supplied with the first voltage and reading data from the plurality of non-volatile memory cells selected from the memory cell array;

a row decoder and a column decoder for the plurality of non-volatile memory cells in the memory cell array;

a second voltage generator generating a second voltage higher than the first voltage; and a third voltage generator generating a third voltage higher than the second voltage, wherein the row decoder is supplied with the second voltage, and the column decoder is supplied with the third voltage.

15. The non-volatile memory device of claim 14, wherein the row decoder and the column decoder are respectively supplied with the second voltage and the external voltage during a write operation and the row decoder and the column decoder are both supplied with the first voltage during a read operation.

* * * * *